(12) United States Patent
Urisu

(10) Patent No.: US 7,414,301 B2
(45) Date of Patent: Aug. 19, 2008

(54) PRINTED CIRCUIT BOARD WITH SOLDERING LANDS

(75) Inventor: Takayoshi Urisu, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 0 days.

(21) Appl. No.: 11/103,004

(22) Filed: Apr. 11, 2005

(65) Prior Publication Data

US 2005/0236718 A1 Oct. 27, 2005

(30) Foreign Application Priority Data

Apr. 16, 2004 (JP) ............................. 2004-121694

(51) Int. Cl.
H05K 3/34 (2006.01)
H05K 3/28 (2006.01)
H01L 23/48 (2006.01)

(52) U.S. Cl. .................... 257/667; 257/E23.011; 257/735; 257/779; 257/773; 257/774; 257/775; 257/776; 257/783; 257/782; 257/781; 257/780; 257/698; 257/696

(58) Field of Classification Search .......... 257/E23.011, 257/735, 667, 779–783, 666, 696, 698, 773–776
See application file for complete search history.

(56) References Cited

U.S. PATENT DOCUMENTS

2002/0179323 A1* 12/2002 Sakai et al. ................. 174/255
2002/0185304 A1* 12/2002 Sakai et al. ................. 174/257
2003/0235043 A1* 12/2003 Yoshida ....................... 361/760

FOREIGN PATENT DOCUMENTS

| JP | 03-38663 | 4/1991 |
| JP | 05-46066 | 6/1993 |
| JP | 07-030241 | 1/1995 |
| JP | 07-106744 | 4/1995 |
| JP | 7-115265 | * 5/1995 |
| JP | 7-326851 | * 12/1995 |
| JP | 10-290065 | 10/1998 |
| JP | 1998-290065 | 10/1998 |
| JP | 11-145607 | * 5/1999 |
| JP | 3088837 | 7/2002 |
| JP | 2003-142810 | 5/2003 |
| JP | 2003-142810 A | 5/2003 |

OTHER PUBLICATIONS

Japan Notice of the reason for refusal, dated Jul. 18, 2007.

* cited by examiner

Primary Examiner—Alexander O Williams
(74) Attorney, Agent, or Firm—Peter Ganjian

(57) ABSTRACT

The present invention provides a printed circuit board having an area of non-resist portion, where each non-resist portion expands gradually toward the back end of a land array in the dipping direction A. Thus the area of solder deposition also expands in the region of the land array, thereby excessive solder does not remain up to the back end of the land array, and resultantly the amount of solder buildup at the backside in the dipping direction A can be reduced. Further, the present invention makes it unnecessary to dispose a dummy land for the prevention of solder buildup at the backmost portion of the land array, and thus the space used for a dummy land can be utilized effectively.

3 Claims, 4 Drawing Sheets

Dipping direction

Dipping direction

Dipping direction

Dipping direction

Dipping direction

PRINTED CIRCUIT BOARD WITH SOLDERING LANDS

BACKGROUND OF THE INVENTION

1. Field of the Invention

The present invention relates to a printed circuit board having land arrays to which solder is applied by flow soldering when an electronic part, in particular an element having plural terminals aligned in a line like an IC, is mounted thereon.

2. Description of the Prior Art

In the case of a land array for multiple terminals on a conventional printed circuit board, on which a surface mount IC element having plural terminals aligned in parallel is mounted by dip soldering, the length of the exposed portion, not covered with a resist, of each land has heretofore been identical. As a result, when flow soldering is applied, solder is likely to spread excessively at the backside, in the direction of flow, of the land array for multiple terminals and there is a tendency to form a solder buildup and cause short-circuiting between terminals.

With regard to the problem, Japanese Unexamined Utility Model Publication No. 038663/1991 describes the technology that reduces the amount of solder buildup at a land having a reduced width by: forming a land the width of which reduces as the distance from the front end of the land increases toward the backside of the land in the direction of the flow of flow soldering; further forming a dummy land acting as a solder reservoir in the vicinity of the back end of the land; and thereby making use of the surface tension of molten solder.

Likewise, JP-A No. 290065/1998 describes the technology that reduces the amount of a solder buildup by: disposing a dummy land at one side of a land relative to the direction of the flow of flow soldering; connecting the dummy land to the land at the back end thereof in the direction of the flow of the flow soldering; and thereby making the dummy land absorb molten solder through the connection.

Further, JP-A No. 142810/2003 discloses the technology that makes short-circuiting hardly occur between terminals by: connecting the land, in a land array for multiple terminals, at the back end in the direction of the flow of flow soldering to a dummy land disposed on the backside of the land in the flow direction through a constricted portion; and making it difficult for the solder once introduced into the dummy land during flow soldering to flow back by the hindrance of the constricted portion.

Furthermore, Japanese Registered Utility Model No. 3088837 discloses the technology that makes short-circuiting hardly occur between terminals by means of: forming the land, in a land array for multiple terminals, at the back end in the direction of the flow of flow soldering so that the width thereof may be wider than those of the other lands; and dividing with silk the land of a wider width into two sections in the direction perpendicular to the direction of dipping.

However, there have been the following problems in the prior technologies explained above.

In order to solve the problem of solder buildup formed on the backside in the direction of the flow of flow soldering, in the above prior technologies, a dummy land is disposed in the vicinity of the relevant land where solder buildup is anticipated and the dummy land is used as a land for a solder reservoir to introduce excessive solder.

In the case of a land array for multiple terminals which is used for surface mount and tends to form solder buildup, since the spaces between adjacent terminals are narrow, it is not practical to adopt the technology disclosed in the aforementioned document of Japanese Unexamined Utility Model Publication No. 038663/1991 or JP-A No. 290065/1998, wherein each land is provided with a dummy land. Further, when the technology described in the aforementioned document of JP-A No. 142810/2003 or Japanese Registered Utility Model No. 3088837 is applied, a space for the disposition of a dummy land or the like is inevitably required at the back end, in the direction of the flow of flow soldering, of an aligned land array. In addition, in the case of disposing a dummy land only at the back end, accumulated solder cannot be absorbed sufficiently in some cases.

SUMMARY OF THE INVENTION

The present invention has been established in order to address the above problems and the object thereof is to provide a printed circuit board not requiring an additional space for a dummy land or the like and being capable of preventing short-circuiting between terminals caused by solder buildup.

In order to solve the above problems, one aspect of the present invention is configured so as to be a printed circuit board, which is provided with a printed pattern on the surface thereof, is covered with a resist except predetermined portions, and has lands for multiple terminals, the lands being used for mounting an IC element having plural terminals aligned on the side edges of the package, characterized in that: each of the lands for terminals is formed so as to extend in the protruding direction of each of the terminals; and the length, in the protruding direction, of each of the exposed portions not covered with the resist increases at the backside in a predetermined direction along the alignment of the terminals.

In the aspect configured as above, it becomes possible to expand the area for solder deposition at a land array for multiple terminals and to make it possible to reduce solder buildup at the backside before it happens by, before molten solder flows toward the backside, in a predetermined direction, of the land array for multiple terminals and builds up there: making use of the surface tension of molten solder; and allowing solder to escape gradually into the exposed portion not covered with the resist in the area where the land array for multiple terminals is located. In addition, by adopting the direction of the flow of flow soldering as the predetermined direction, it becomes possible to obtain the above effects easily, and also when an element is attached to a printed circuit board by hand, the application of the present invention to the direction of soldering contributes also to the improvement of the durability of the land array when the element is attached and detached repeatedly, in addition to the above effects.

In the aspect of the present invention, when an IC element selected from various kinds is soldered, at a land array for multiple terminals on a printed circuit board, the area of the exposed portion not covered with a resist is expanded, thus the area for solder deposition increases, thereby solder becomes less likely to remain at the backside, and hence short-circuiting between terminals can be prevented. As a result, rework reduces and the yield improves at visual inspection and hence the effect of improving productivity can be expected. Above effects can be expected also in the cases of surface mounting and through hole mounting.

A means of modifying the shape of such an exposed portion as described above in order to avoid solder buildup at the backside is explained in detail.

When soldering is applied to a land array for multiple terminals, excessively deposited solder is introduced into the adjacent land on the backside in the direction of flow by the effect of surface tension, and thereby molten solder accumulates at the back end where the next land is not prepared. To cope with the problem, there have been the technologies of avoiding the problem by disposing a dummy land at the backside of the tail end in the case of a land array for multiple terminals having conventional non-resist portions of an identical size.

According to another aspect, wherein no dummy land is employed, of the present invention, exposed portions may be configured so that the length thereof gradually increases as the distance from the front end exposed portion increases toward a backside exposed portion in the predetermined direction.

In the aspect configured as above, it is possible to gradually expand the solder deposition area of each land in a land array for multiple terminals continuously from the front side to the backside in the predetermined direction by: increasing the length, in the protruding direction of each of the terminals, of the exposed portion not covered with a resist at each land of the land array for multiple terminals as the distance from the front end exposed portion increases toward a backside exposed portion in the predetermined direction while forming a slope on the tip of each exposed portion; and linking each formed trapezoidal exposed portion to another from the front side to the backside, whereas the length of the exposed portions has been constant in the case of a conventional land array for multiple terminals.

In this way, the buildup of solder is prevented by allowing excessive molten solder to flow into the exposed portions expanded gradually from the front side.

By so doing, it becomes possible to expand the solder deposition area of each land at a land array for multiple terminals gradually from the front side to the backside in the predetermined direction, and the effect of reducing the buildup of solder at the backside can be obtained before it happens by allowing solder to escape into the exposed portion not covered with the resist gradually from the front side of the land array for multiple terminals before molten solder flows toward the backside of the land array for multiple terminals and builds up there.

As one of the modifications of the above means, each exposed portion may be configured so that the length of each exposed portion may gradually increase stepwise as the distance from the front end exposed portion increased toward a backside exposed portion in the predetermined direction.

In the modification configured as above, the integrated exposed portion forms a step-like shape by: forming the extending tip of the exposed portion at each land into a rectangular shape individually; increasing the length, in the protruding direction of each of the terminals, of each exposed portion as the distance from the front end exposed portion increases toward a backside exposed portion; and linking the adjacent exposed portions to each other side by side.

Considering the editing work of a layout of a printed circuit board with CAD, in the case where exposed portions are not laid out as an integrated area extending from the front end to the back end of a land array but laid out so as to align independent rectangular exposed portions each of which extends from each land with a spaced between adjacent exposed portions at the same intervals as the lands, it is much easier for the editing work to adopt a step-like shape. In this way, it becomes possible to gradually expand the solder deposition area of each land at a land array for multiple terminals from the front side to the backside in the predetermined direction, and the effect of preventing the buildup of solder is obtained by allowing excessive molten solder to flow into the exposed portions expanded gradually from the front side.

By so doing, it becomes possible to expand the solder deposition area of each land at a land array for multiple terminals gradually from the front side to the backside in the predetermined direction, and the effect of reducing the buildup of solder at the backside can be obtained before it happens by allowing solder to escape into the exposed portion not covered with the resist gradually from the front side of the land array for multiple terminals before molten solder flows toward the backside of the land array for multiple terminals and builds up there.

In the above case, the area of each exposed portion not covered with the resist is expanded from the front side to the backside in the predetermined direction. However, as long as excessive molten solder does not remain at the back end land in a land array, it is not always necessary to expand the area of the exposed portion at the back end land or to commence expanding the area of the exposed portion from at front end land.

The area of each exposed portion may be expanded at some lands of a land array and, as an example of expanding the area of each exposed portion at some lands of a land array, the exposed portions may be configured so as to be characterized in that the length of each exposed portion gradually increases as the distance from the front end exposed portion increases toward a backside exposed portion in a predetermined land array region at the backside in the predetermined direction.

When such a configuration is adopted, the length of each exposed portion not covered with a resist increases as the distance from the front end exposed portion increases toward a backside exposed portion in a predetermined direction. The specific feature thereof is that the length, in the protruding direction of each of the terminals, of each exposed portion increases as the distance from the front end exposed portion increases toward a backside exposed portion within a predetermined land array range at the backside while forming a slope on the tip of each exposed portion.

By so doing, it becomes possible to expand the solder deposition area of each land at a land array for multiple terminals gradually from the front end exposed portion toward the backside within a predetermined land array range at the backside in the predetermined direction, and the effect of reducing the buildup of solder at the backside can be obtained before it happens by allowing solder to escape into the exposed portion not covered with the resist gradually from the front side of the land array for multiple terminals before molten solder flows toward the backside of the land array for multiple terminals and builds up there.

As described above, each exposed portion not covered with a resist is required only to be configured so as to expand toward the backside in the predetermined direction, and the position thereof may be anywhere in the range of the land array in a predetermined direction unless excessive solder spreads on the exposed portion and causes solder buildup, and the length thereof extending in the direction perpendicular to the predetermined direction is not specified either.

Further, according to another aspect of the present invention, a printed circuit board may be configured so as to be characterized in that the predetermined direction is identical to the direction of the flow of flow soldering.

In the aspect configured as above, expanding the solder deposition area of each land at a land array for multiple terminals gradually from the front side to the backside in the direction of the flow of flow soldering enables solder buildup to be eliminated little by little from the front side lands. Accordingly, solder does not accumulate abundantly at the backside, and hence it becomes possible to avoid excessive spread of solder at the backside of the land array for multiple terminals.

In this way, the direction of the flow of flow soldering can be adopted as a predetermined direction and the aforementioned effects can be obtained.

Furthermore, according to another aspect of the present invention, a printed circuit board may be configured so as to be characterized in that the lands for multiple terminals are lands to dip-solder a surface mount device.

In the aspect configured as above, it becomes possible to apply the present invention to a surface mount device.

According to still another aspect of the present invention, a printed circuit board may be configured so as to be characterized in that the lands for multiple terminals are lands having holes to insert leads to dip-solder a through hole mounting device.

In the aspect configured as above, it becomes possible to apply the present invention to a through hole mounting device having lead terminals and being inserted from the back of the flow soldering face.

Here, as one modifications, the present invention may be configured so as to be a printed circuit board, which is provided with a printed pattern on the surface thereof, is covered with a resist except predetermined portions, and has lands for multiple terminals, the lands being used for dip-soldering a surface mount IC element having plural terminals aligned on the side edges of the package, characterized in that: each of the lands for terminals is formed so as to extend in the protruding direction of each of the terminals; and the length, in the protruding direction, of each of the exposed portions not covered with the resist gradually increases stepwise as the distance from the front end exposed portion increases toward a backside exposed portion in the direction of the flow of flow soldering along the alignment of the terminals.

By the modification, when a surface mount IC element is dip-soldered by flow soldering, at a land array for multiple terminals on a printed circuit board, whereas, in a conventional technology, a dummy land for absorbing solder buildup is disposed in the vicinity of the land at the back end in the dipping direction, in the aspect of the present invention, the area of each exposed portion not covered with a resist is expanded, thus a solder deposition area at each land increases, thereby solder becomes less likely to remain at the backside in the dipping direction, hence an additional space for a dummy land is not required anymore, that is advantageous in the design of a wiring pattern, and resultantly it becomes possible to provide a printed circuit board capable of making an effective use of the space on the printed circuit board and preventing short-circuiting between terminals caused by solder buildup. As a result, rework reduces and the yield improves at visual inspection after flow soldering and hence the effect of improving productivity can be expected.

Other and further objects, features and advantages of the invention will appear more fully from the following description.

DESCRIPTION OF THE PREFERRED EMBODIMENTS

Here, embodiments according to the present invention are explained in the following order:
(1) The first embodiment,
(2) The second embodiment,
(3) The third embodiment,
(4) Summary.

(1) The First Embodiment

Figure 1:
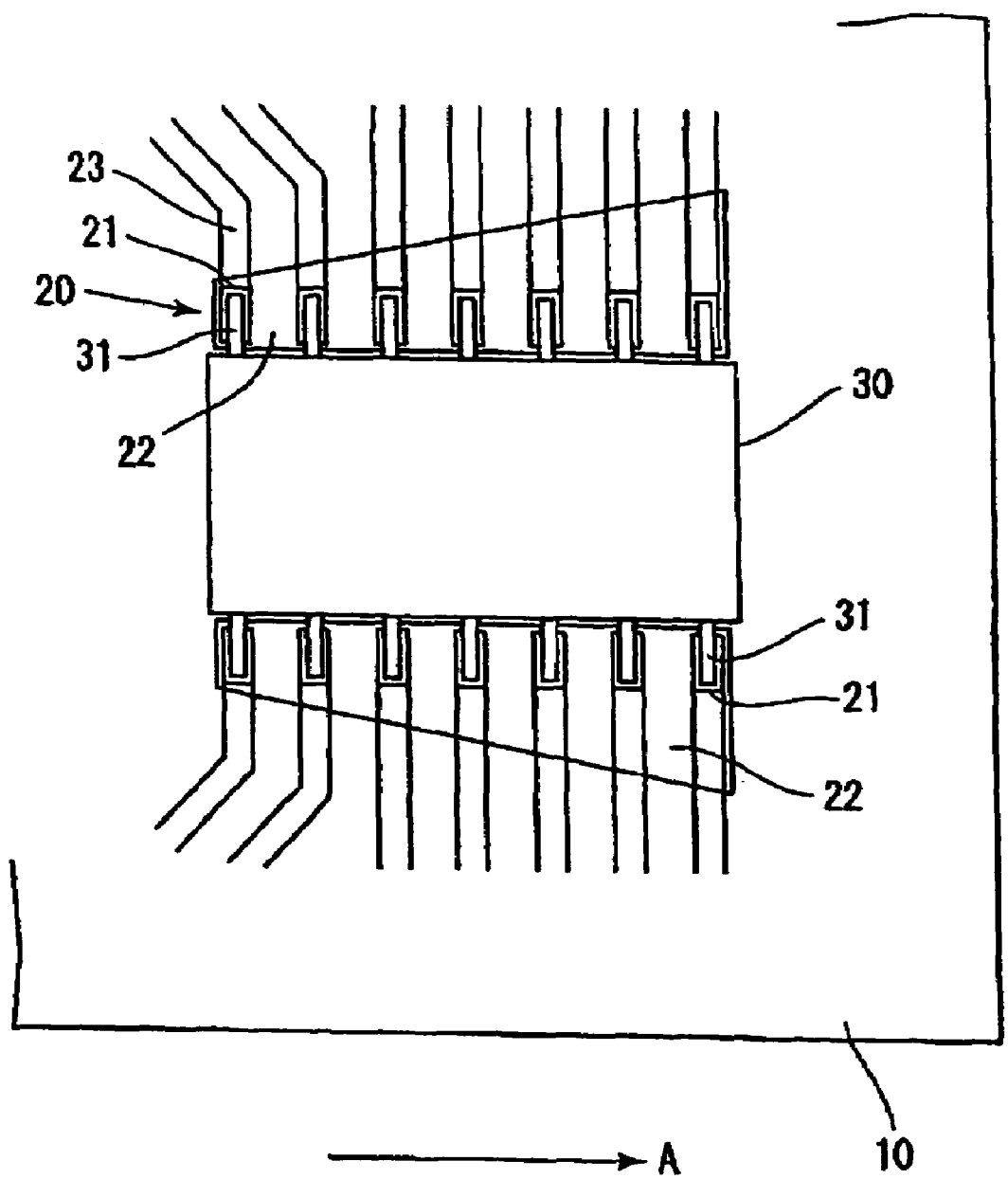
FIG. 1 is a schematic plan view of a printed circuit board according to the first embodiment.

FIG. 1 is a schematic plan view of a printed circuit board according to the present embodiment.

In the present embodiment, a printed circuit board 10 has plural land arrays, each of which comprises lands 20 aligned in the dipping direction A, to dip-solder a surface mount IC. A land 20 is composed of: a land pattern 21 of a rectangular shape having the narrow side in the dipping direction; and a non-resist portion 22 formed by exfoliating a resist with which the pattern layer is covered at the portion touching a terminal 31 so as to be larger than the land pattern 21 from the top to the end of a land array. A wiring pattern 23 extends from each land pattern 21 toward the outside of an IC package 30 in the direction perpendicular to the dipping direction A.

The non-resist portion 22 has a trapezoidal shape; the width thereof is the distance from the front end to the back end of the land pattern array in the dipping direction A and the length thereof in the direction perpendicular to the IC package 30 increases little by little as the distance from the front end of the land pattern array increases toward the backside thereof in the dipping direction A so that a sloping line is formed by connecting the tip of the non-resist portion 22 at the front end in the dipping direction A with the tip of the non-resist portion 22, which has the longest length, at the back end in the same direction. And the non-resist portion 22 is formed by exfoliating the resist in the area of the trapezoidal shape.

Figure 2:
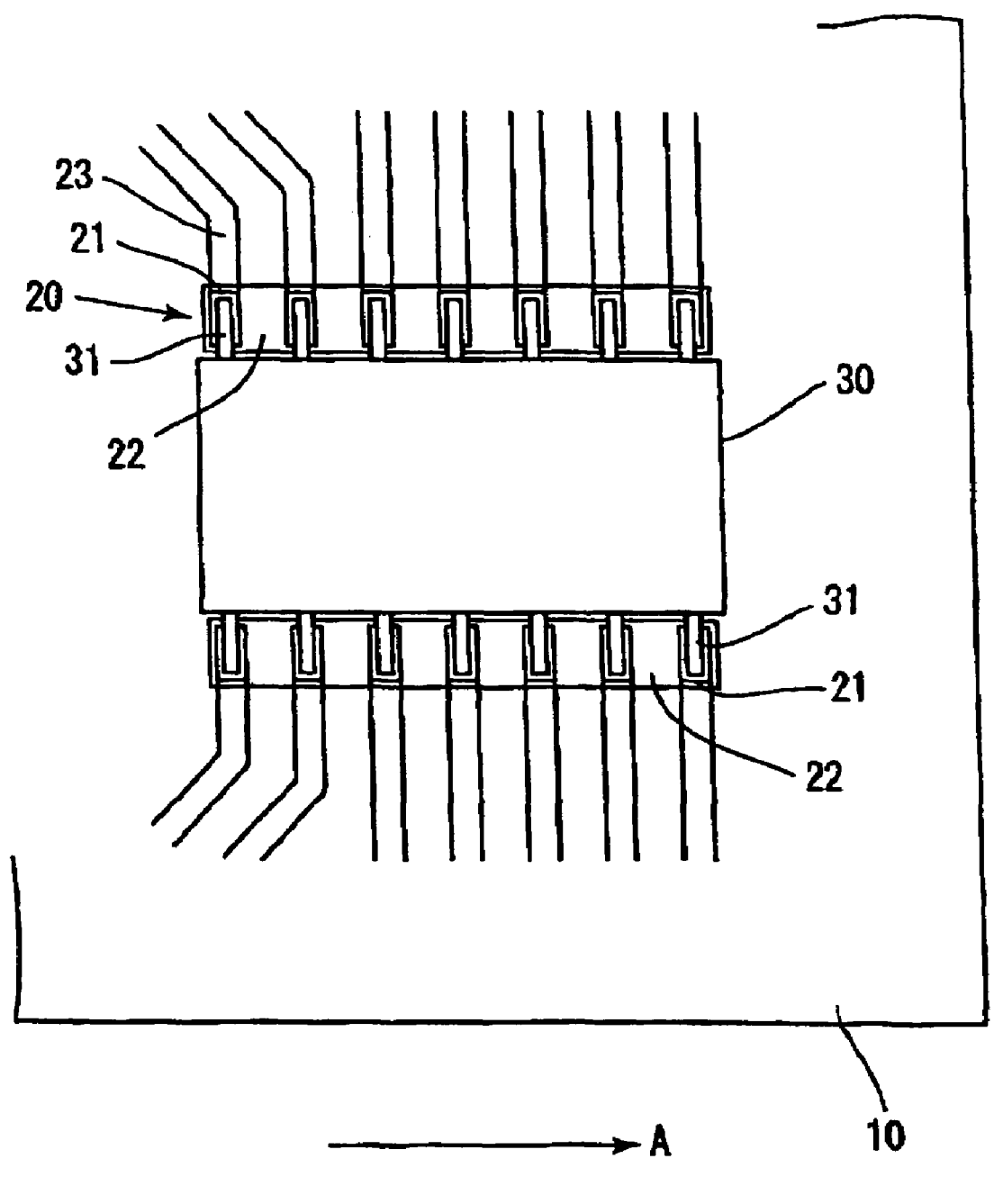
FIG. 2 is a schematic plan view of a conventional printed circuit board.

In this case, with regard to the length of the non-resist portion 22 in the longitudinal direction, the length of the narrow side, namely the front end land, of the trapezoidal shape is larger than the length of the land pattern 21 and identical to the constant length of a conventional non-resist portion shown in FIG. 2. Then the length increases gradually from the length at the beginning, and the length of the long side, namely the non-resist portion 22 at the back end, of the trapezoidal shape extends beyond the length of the land pattern 21, even reaches the wiring pattern 23, and thus the area from the land pattern 21 up to the wiring pattern 23 is exposed continuously.

Operation of soldering a surface mount device on a printed circuit board 10 configured as above is explained hereunder.

In the present embodiment, each terminal 31 of a rectangular SOP-type IC element for surface mount having plural terminals 31 at the long side thereof is mounted on the relevant land 20 so that the long side thereof is parallel with the dipping direction A. Then firstly, tack solder is placed at a first terminal 31 located at the left end on the upper side of the IC and the terminal 31 is positioned. Thereafter, another tack solder is placed at a second terminal 31 located at the right end on the lower side of the IC symmetrically to the first terminal 31 about a point, then the assembled printed circuit board passes through a reflow furnace with the face on which the IC element is placed being upside, and thus the position of the IC is fixed.

After the IC is fixed as stated above, the assembled unit is subjected to soldering by inserting it into a solder machine with the face on which the IC is placed being downside. At this time, since the melting point of the tack solder is high, even when flux is applied and the assembled unit passes through a preheater for preheating it in the solder machine, the IC element does not slip off from the printed circuit board and can keep the fixed position up to a solder bath.

The terminals 31 and the lands 20 are soldered in the solder bath sequentially in the dipping direction A. At this time, the printed circuit board 10 travels in the direction opposite the dipping direction A.

In the present embodiment, the solder excessively applied to the front end land 20, in the dipping direction A, which is dip-soldered at the start is introduced into the next land 20 neighboring the front end land 20 and thereby excessive spread of solder at the front end land 20 is avoided. Further, since the length of the neighboring land 20 increases slightly, the excessive solder spreads through the pattern exposed portion and thus the amount of the excessive solder decreases as the soldered portion advances backward. The soldering process is repeated between adjacent lands 20 in sequence up to the soldering of the back end land 20, and the soldering is completed without the buildup of excessive solder at the back end land 20.

Consequently, it is unlikely that excessive solder builds up at the last land 20 and hence the frequency of short-circuiting between terminals, which generally occurs at a backside portion during flow soldering, reduces considerably. In this way, though visual inspection and rework have heretofore been required after dip soldering, those works are relieved, thereby the cost incurred in the time for the work is reduced, the yield loss by the rework is also reduced, and resultantly productivity improves.

(2) The Second Embodiment

Figure 3:
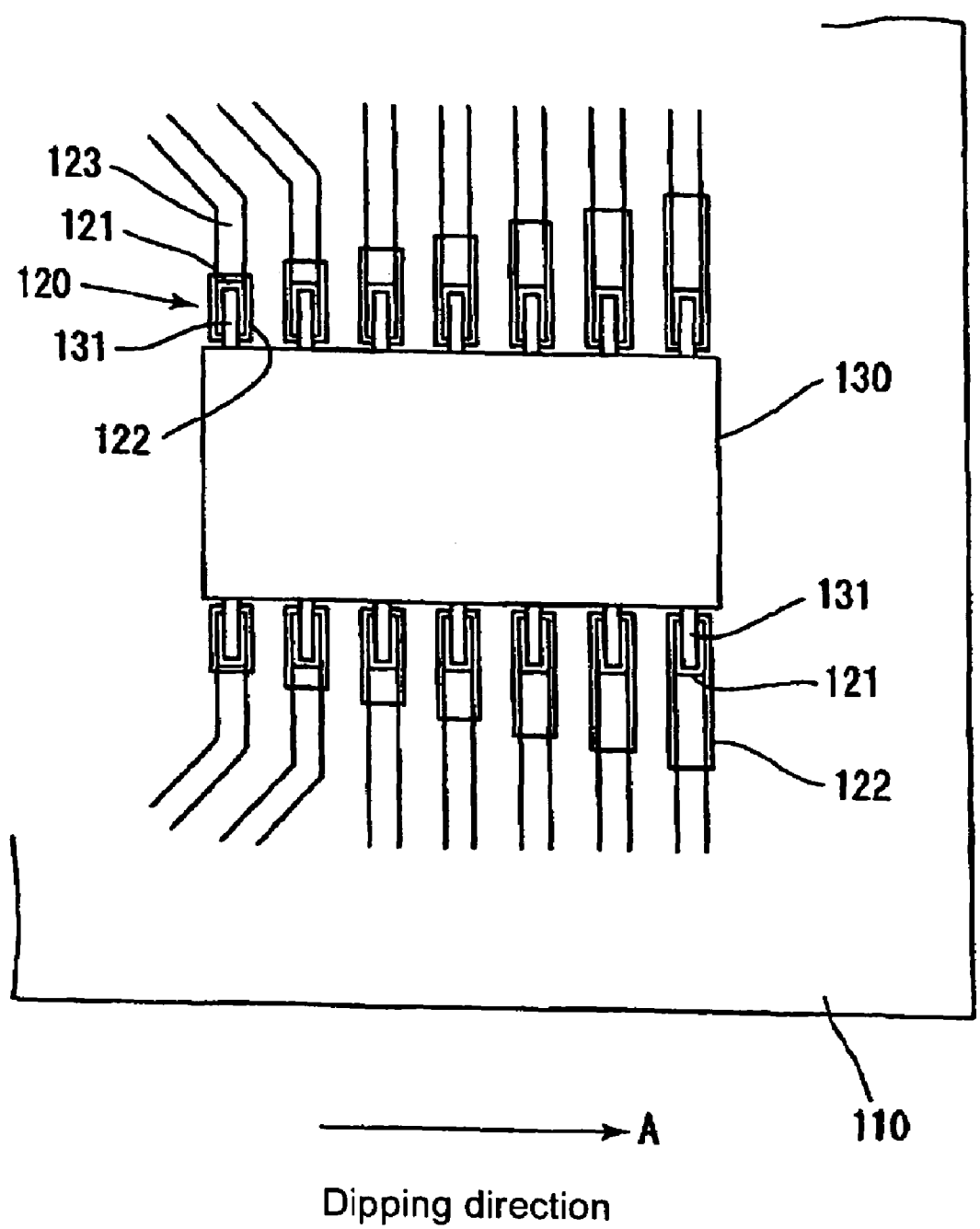
FIG. 3 is a schematic plan view of a printed circuit board according to the second embodiment.

FIG. 3 is a schematic plan view of a printed circuit board according to the present embodiment. The example of a modification of a non-resist portion 22 in the above first embodiment is explained.

In the present embodiment, a printed circuit board 110 has plural land arrays, each of which comprises lands 120 aligned in the dipping direction A, to dip-solder a surface mount IC. A land 120 is composed of: a land pattern 121 of a rectangular shape having the narrow side in the dipping direction; and a non-resist portion 122 formed by exfoliating a resist with which the pattern layer is covered at the portion touching a terminal 131 so as to be larger than the land pattern 121. A wiring pattern 123 extends from each land pattern 121 toward the outside of an IC package 130 in the direction perpendicular to the dipping direction A.

The non-resist portion 122 has a step-like shape; the width thereof is the distance from the front end to the back end of the land pattern array in the dipping direction A and the length thereof in the direction perpendicular to the IC package 130 increases little by little as the distance from the front end of the land pattern array increases toward the backside in the dipping direction A so that the rectangular non-resist portions are aligned stepwise from the front end non-resist portion to the back end non-resist portion, which has the longest length, in the dipping direction A. And the non-resist portion 122 is formed by exfoliating the resist in the area of the step-like shape.

In this case, with regard to the length of the non-resist portion 122 in the longitudinal direction, the length of the narrow side, namely the front end land, of the trapezoidal shape is larger than the length of the land pattern 121 and identical to the constant length of a conventional non-resist portion shown in FIG. 2. Then the length increases gradually from the length at the beginning, and the length of the long side, namely the non-resist portion 122 at the back end, extends beyond the length of the land pattern 121, even reaches the wiring pattern 123, and thus the area from the land pattern 121 up to the wiring pattern 123 is exposed continuously.

The above land pattern 121 is laid out so as to remove a resist with which the pattern layer is covered to form a predetermined size with a pattern extending from each land 120 toward the outside of the IC package 130. However, the land pattern 121 itself may be laid out directly to the predetermined size.

A land pattern 121 may take an elliptic shape having the narrow side in the dipping direction A as shown in the figure. Further, with regard to the relationship between the size of the original land pattern 121 and the size of the non-resist portion 122, the non-resist portion 122 may be formed either so as to be larger than the land pattern 121 as described above or so as to squeeze into the land pattern 121, and it depends on the shape recommended for a component to be soldered.

(3) The Third Embodiment

Figure 4:
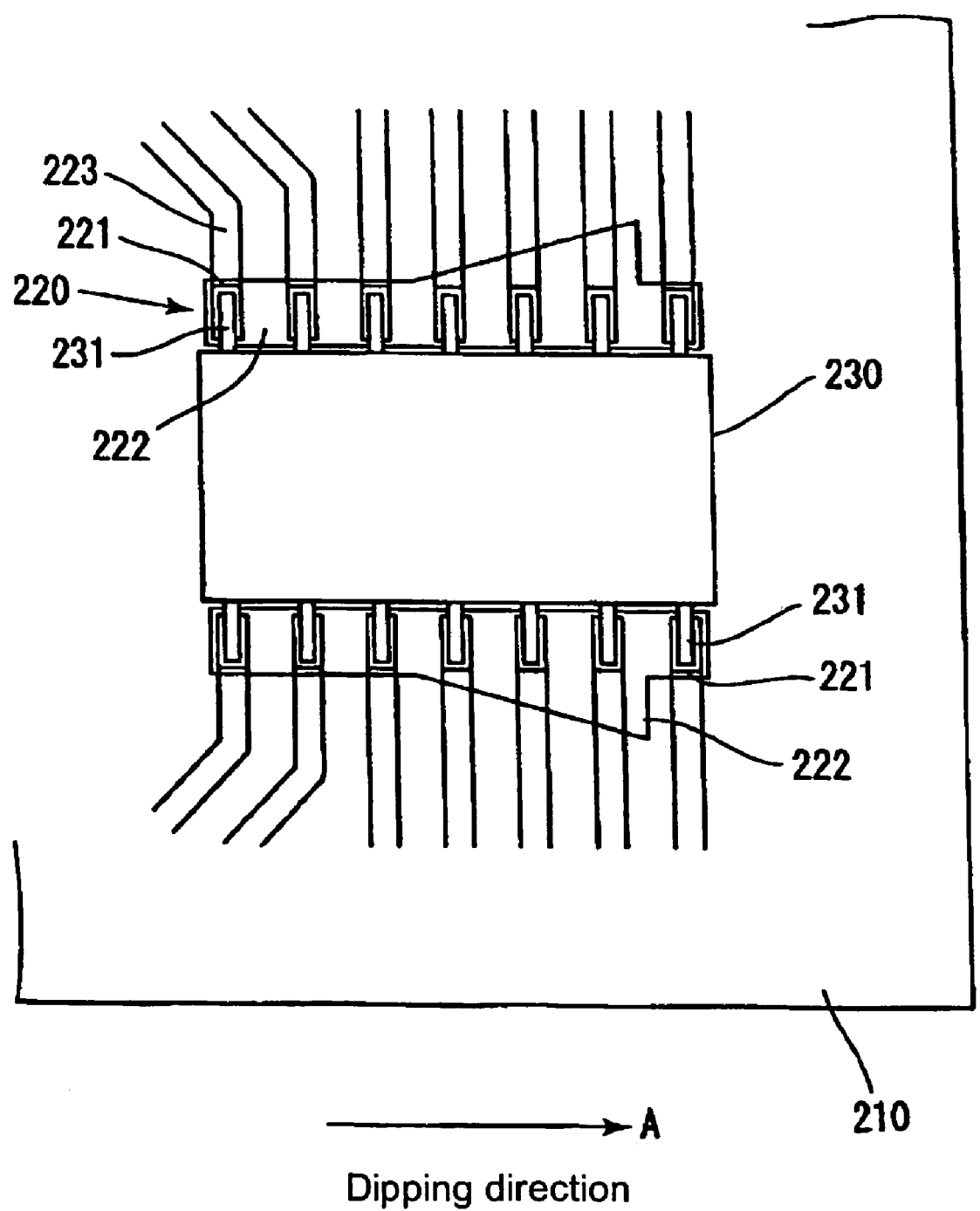
FIG. 4 is a schematic plan view of a printed circuit board according to the third embodiment.

FIG. 4 is a schematic plan view of a printed circuit board according to the present embodiment as the example of a modification of a non-resist portion 22.

In the present embodiment, a printed circuit board 210 has plural land arrays, each of which comprises lands 220 aligned in the dipping direction A, to dip-solder a surface mount IC. In the aforementioned first and second embodiments, the area of the non-resist portion 22 at each land is expanded from the front side to the backside in the predetermined direction. However, as long as excessive molten solder does not remain at the back end land 220 in a land array, it is not always necessary to expand the area of the non-resist portion 22 at the back end land 220 or to commence expanding the area of the non-resist portion 22 from the front end land. The position where the area of a non-resist portion 22 is expanded may be anywhere so long as the position is somewhere in the region of the land array of the non-resist portion 22. An example is shown below.

A land 220 of the present embodiment is composed of: a land pattern 221 of a rectangular shape having the narrow side in the dipping direction; and a non-resist portion 222 formed by exfoliating a resist with which the pattern layer is covered at the portion touching a terminal 231 so as to be larger than the land pattern 221. A wiring pattern 223 extends from each land pattern 221 toward the outside of an IC package 230 in the direction perpendicular to the dipping direction A.

The non-resist portion 222 has a trapezoidal shape in part; the width thereof is the distance from the front end to the back end of the land pattern array in the dipping direction A and the length thereof in the direction perpendicular to the IC package 230 increases little by little as the distance from the front end of the land pattern array increases toward the backside thereof in the dipping direction A so that a sloping line is formed by connecting the tip of the non-resist portion 222 at the front end in the dipping direction A with the tip of the non-resist portion 222, which has the longest length, at the back end in the same direction. And the non-resist portion 222 is formed by exfoliating the resist in the area of the shape partially comprising the trapezoidal shape.

In this case, with regard to the length of the non-resist portion 222 in the longitudinal direction, the length of the front end land 220 is larger than the length of the land pattern 221 and identical to the constant length of a conventional non-resist portion shown in FIG. 2. The length is maintained up to an arbitrary position and then increases gradually as the next land 220 being the start point. The length of the non-resist portion 222 at an arbitrary portion of the backside increases beyond the length of the land pattern 221 and reaches the wiring pattern 223, and thus the area from the land pattern 221 up to the wiring pattern 223 is exposed continuously. Then the next land 220 is formed in the same size as a land formed in the front side.

In the above embodiment too, it is unlikely that excessive solder builds up at the last land 220 and hence the frequency of short-circuiting between terminals, which generally occurs at a backside portion during flow soldering, reduces considerably.

The types of printed circuit boards on each of which a component such as an IC package 30 is surface-mounted are shown in FIGS. 1 to 4. However, the present invention is applicable also to the lands for a through hole mounting device which is designed to be soldered to the land pattern on the bottom surface by inserting terminals into the holes of a printed circuit board.

(4) Summary

As explained above, in the present invention, the area of each non-resist portion 22 expands gradually toward the back end of a land array in the dipping direction A, thus the area of solder deposition also expands in the region of the land array, thereby excessive solder does not remain up to the back end of the land array, and resultantly the amount of solder buildup at the backside in the dipping direction A can be reduced. Further, the present invention makes it unnecessary to dispose a dummy land for the prevention of solder buildup at the backmost portion of the land array, and thus the space used for a dummy land can be utilized effectively.

In addition, a non-resist portion 22 can take any shape as long as the area thereof expands toward the backside in a predetermined direction and any position in the region of the land array as long as excessive solder does not spread over the parts of the non-resist portion 22 and cause solder buildup, and also can take any length in the direction perpendicular to the predetermined direction.

In this way, the present invention makes it possible to provide a printed circuit board that can: prevent short-circuiting between terminals caused by solder buildup; reduce the deterioration of yield caused by visual inspection and rework after dip soldering; and improve productivity accordingly.

The foregoing invention has been described in terms of preferred embodiments. However, those skilled, in the art will recognize that many variations of such embodiments exist. Such variations are intended to be within the scope of the present invention and the appended claims.

I claim:

1. A printed circuit board, comprising:
an array of lands that are aligned along a dipping direction for dip-soldering a device thereon;
the lands, comprising:
a land pattern;
a wiring pattern extending from the land pattern, perpendicular the dipping direction and away from the device;
a non-resist portion having topography, comprising:
a first, second, and third continuous sections that vary in size;
the first section is substantially commensurate in size with one or more land patterns that are located near a front end of the dipping direction;
the second section having a varying length that is gradually increased along the dipping direction, covering one or more land patterns and wiring patterns that are aligned and located between the front end and a back end of the dipping direction; and
the third section is substantially commensurate in size with one or more land patterns that are located near the back end of the dipping direction.

2. A printed circuit board according to claim 1, wherein said lands for multiple terminals are lands to dip-solder a surface mount Integrated Circuit (IC).

3. A printed circuit board according to claim 1, wherein said lands for multiple terminals are lands having holes to insert leads to dip-solder a through hole mounting device.

* * * * *